United States Patent
Seo et al.

(10) Patent No.: US 7,394,290 B2
(45) Date of Patent: Jul. 1, 2008

(54) SEMICONDUCTOR INTEGRATED CIRCUIT

(75) Inventors: Young-Hun Seo, Gyeonggi-do (KR); Jong-Hyun Choi, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 81 days.

(21) Appl. No.: 11/422,856

(22) Filed: Jun. 7, 2006

(65) Prior Publication Data

US 2007/0152706 A1 Jul. 5, 2007

(30) Foreign Application Priority Data

Jan. 2, 2006 (KR) .................... 10-2006-0000176

(51) Int. Cl.
*H03K 19/0175* (2006.01)
(52) U.S. Cl. .............................. 326/81; 326/27; 326/82
(58) Field of Classification Search .................. 326/26, 326/27, 82, 83; 327/534, 535
See application file for complete search history.

(56) References Cited

U.S. PATENT DOCUMENTS

| 6,118,328 | A * | 9/2000 | Morikawa ................... 327/534 |
| 6,512,394 | B1 | 1/2003 | Parris | |
| 6,933,744 | B2 * | 8/2005 | Das et al. ...................... 326/17 |

FOREIGN PATENT DOCUMENTS

| JP | 11-214962 | 8/1999 |
| JP | 2000-183180 | 6/2000 |
| KR | 2003-0001975 | 1/2003 |
| KR | 10-2006-0022296 | 3/2006 |
| KR | 10-2006-0046759 | 5/2006 |
| KR | 10-2006-0070448 | 6/2006 |

OTHER PUBLICATIONS

English language abstract of Japanese Publication No. 11-214962, Aug. 6, 1999.
English language abstract of Japanese Publication No. 2000-183180, Jun. 30, 2000.

* cited by examiner

*Primary Examiner*—Don P Le
(74) *Attorney, Agent, or Firm*—Marger Johnson & McCollom, P.C.

(57) ABSTRACT

A semiconductor integrated circuit with low power consumption is provided. In one embodiment, the semiconductor integrated circuit includes a logic circuit portion that is connected between a first power line and a virtual ground line. The logic circuit portion includes at least one NMOS transistor having a first threshold voltage and at least one PMOS transistor having a second threshold voltage. The semiconductor integrated circuit further includes a first MOS transistor, which is connected between the virtual ground line and a ground voltage, where the first MOS transistor has the first threshold voltage and applies the ground voltage to the virtual ground line in an active state. Also included in the semiconductor integrated circuit is a controller that is connected to the first MOS transistor, where the controller applies the ground voltage to the first MOS transistor in the active state and applies a bulk voltage supplied from a bulk power line in a standby state to control a threshold voltage of the first MOS transistor.

22 Claims, 4 Drawing Sheets

SEMICONDUCTOR INTEGRATED CIRCUIT

CROSS-REFERENCE TO RELATED APPLICATION

This application claims the benefit of Korean Patent Application No. 2006-176, filed Jan. 2, 2006, the disclosure of which is hereby incorporated by reference in its entirety.

BACKGROUND

1. Field of the Invention

The present invention relates to a semiconductor integrated circuit and, more particularly, to a semiconductor integrated circuit with low power consumption.

2. Description of the Related Art

Portable electronic devices are different from general electronic devices because they are driven by a battery. Thus, it is important to reduce power consumption in the portable electronic device. In a large scale integrated circuit (LSI) chip employed in the portable electronic device, the power consumption is one of the important design factors. The power consumption problem with the portable electronic device which employs the LSI chip generally has two classifications. One is the power consumption which occurs in an active state of the LSI chip, and the other is the power consumption that occurs in a standby state. For example, in case of a personal digital assistant (PDA), its LSI chip stays in the active state when a user continuously inputs data or executes a certain application program. However, when there is no data input or no execution of the application program during a certain time period, the LSI chip enters the standby state in which only internal requisite data necessary for returning to a normal operation are kept.

In the standby state, a clock necessary for the operation of the LSI chip turns off, and only a power voltage VDD is applied. Thus, hardware and software is designed such that even in the standby state the internal state of the LSI chip and stored data are maintained until the LSI chip returns to an active state.

In the case of the portable electronic device, standby time is generally longer than operation time. Thus, it is important to reduce the power consumption in the standby state. For the foregoing reason, LSI chips are being developed to provide various standby modes and minimize electric currents in the standby state.

In order to maintain data in the standby state, the LSI chip for the portable electronic device can be implemented with static logic. When the portable electronic device is designed with static logic, most of the power consumption is caused from leakage currents, such as a leakage current between the power voltage and the ground voltage, a leakage current in the PN junctions, and the like. Conventional methods for reducing the power consumption and improving the performance of the LSI chip have depended on a scaling down technique. That is, as a device is scaled down, the performance is improved by the shorter channel of a MOS transistor and the corresponding reduced capacitance. This, in turn, leads to lower power consumption and reduced operation voltage.

However, if a device is scaled down past a predetermined level, the operation speed can be significantly lowered due to an increase in the threshold voltage of a transistor. Therefore, in order to solve the problem, the threshold voltage of the transistor needs to also be lowered. However, if the threshold voltage of the transistor is low, the transistor may not be completely turned off in an off state resulting in a large amount of leakage current.

In order to solve the problem, a multi-threshold CMOS (MTCMOS) technique has been suggested.

FIG. 1 is a circuit diagram illustrating a conventional semiconductor integrated circuit.

The semiconductor integrated circuit of FIG. 1 includes a transistor having a low threshold and a transistor having a high threshold voltage. Transistors which constitute a logic circuit portion 10 are transistors having a low threshold voltage, and a transistor having a higher threshold voltage than the transistors of the logic circuit portion 10 is an NMOS transistor NM1.

One end of the NMOS transistor NM1 is connected to a ground voltage VSS, the other end is connected to a virtual ground V-GND, and a gate is connected to an active signal ACT. The logic circuit portion 10 which comprises the transistors having a low threshold voltage is arranged between a power voltage VDD and the virtual ground V-GND.

When the active signal ACT having a high level is applied in the active state of the MTCMOS circuit, the NMOS transistor NM1 having a high threshold voltage is turned on, and the virtual ground V-GND functions as an actual ground voltage and the resistance of the circuit is reduced.

On the other hand, when the active signal ACT has a low level in the standby state, the NMOS transistor NM1 is turned off, and the virtual ground V-GND is floated so that the ground voltage is blocked, which prevents leakage current from flowing.

That is, the MTCMOS turns on the NMOS transistor NM1 having a high threshold voltage to allow the electric current to flow before the logic circuit portion 10 enters the active state and turns off the NMOS transistor NM1 to block the leakage current when the logic circuit portion 10 enters the standby state.

The conventional semiconductor integrated circuit described above reduces the power consumption in the standby state, but since the MOS transistor having a high threshold voltage is used as a switch for controlling the power, when the NMOS transistor NM1 is turned on, the virtual ground V-GND and the ground voltage VSS are momentarily connected, which creates noise such as ground bounce noise in the supplied electric current, which may inhibit smooth transitional operation.

SUMMARY

Embodiments of the present invention provide a semiconductor integrated circuit with reduced noise levels and improved electric supply current.

In one embodiment, a semiconductor integrated circuit includes a logic circuit portion that is connected between a first power line and a virtual ground line. The logic circuit portion includes at least one NMOS transistor having a first threshold voltage and at least one PMOS transistor having a second threshold voltage. The semiconductor integrated circuit further includes a first MOS transistor, which is connected between the virtual ground line and a ground voltage, where the first MOS transistor has the first threshold voltage and applies the ground voltage to the virtual ground line in an active state. Also included in the semiconductor integrated circuit is a controller that is connected to the first MOS transistor, where the controller applies the ground voltage to the first MOS transistor in the active state and applies a bulk voltage supplied from a bulk power line in a standby state to control a threshold voltage of the first MOS transistor.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION

Figure 1:
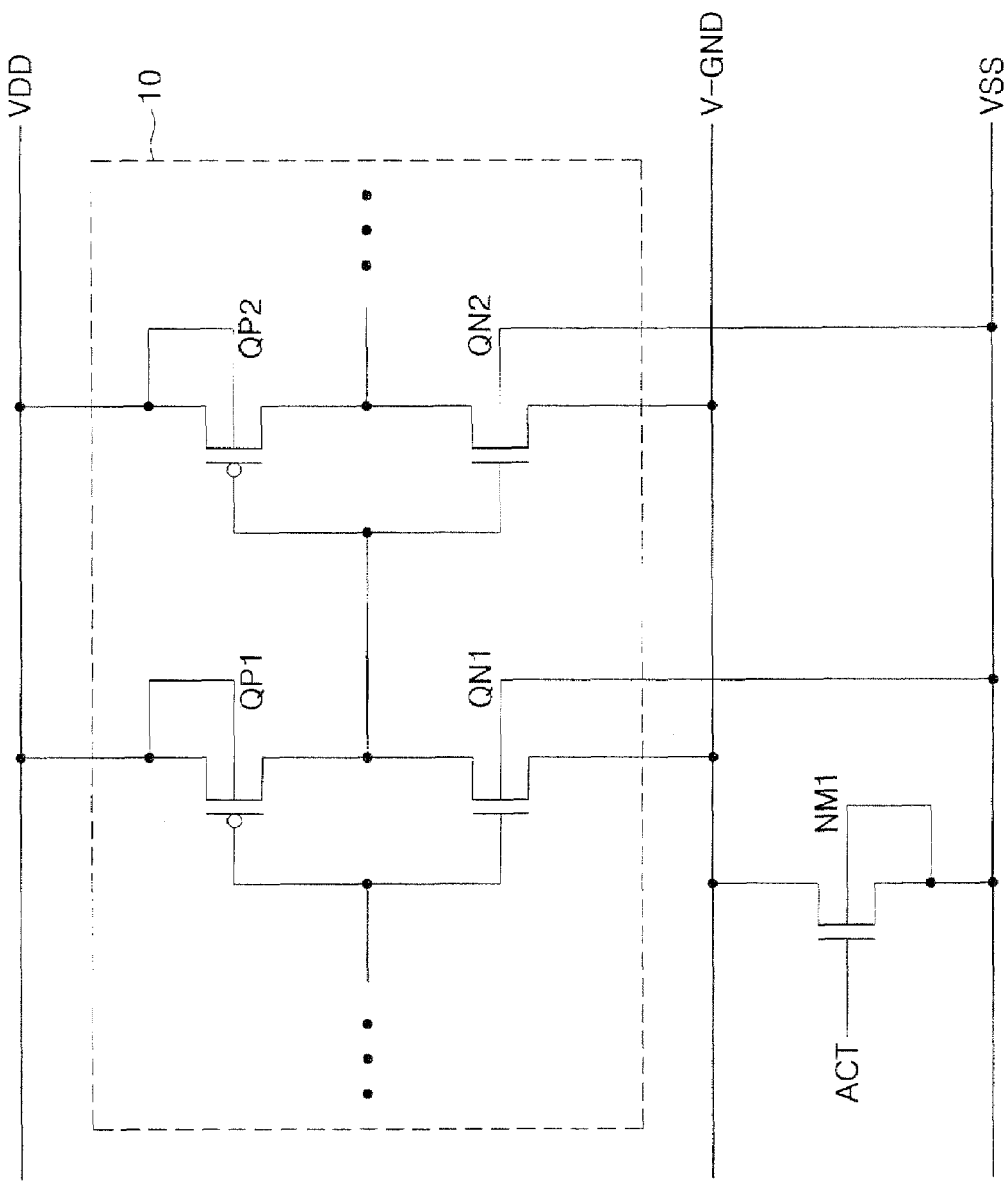
FIG. 1 is a circuit diagram illustrating a conventional semiconductor integrated circuit.

The present invention will now be described more fully hereinafter with reference to the accompanying drawings, in which exemplary embodiments of the invention are shown. This invention may, however, be embodied in many different forms and should therefore not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

Figure 2:
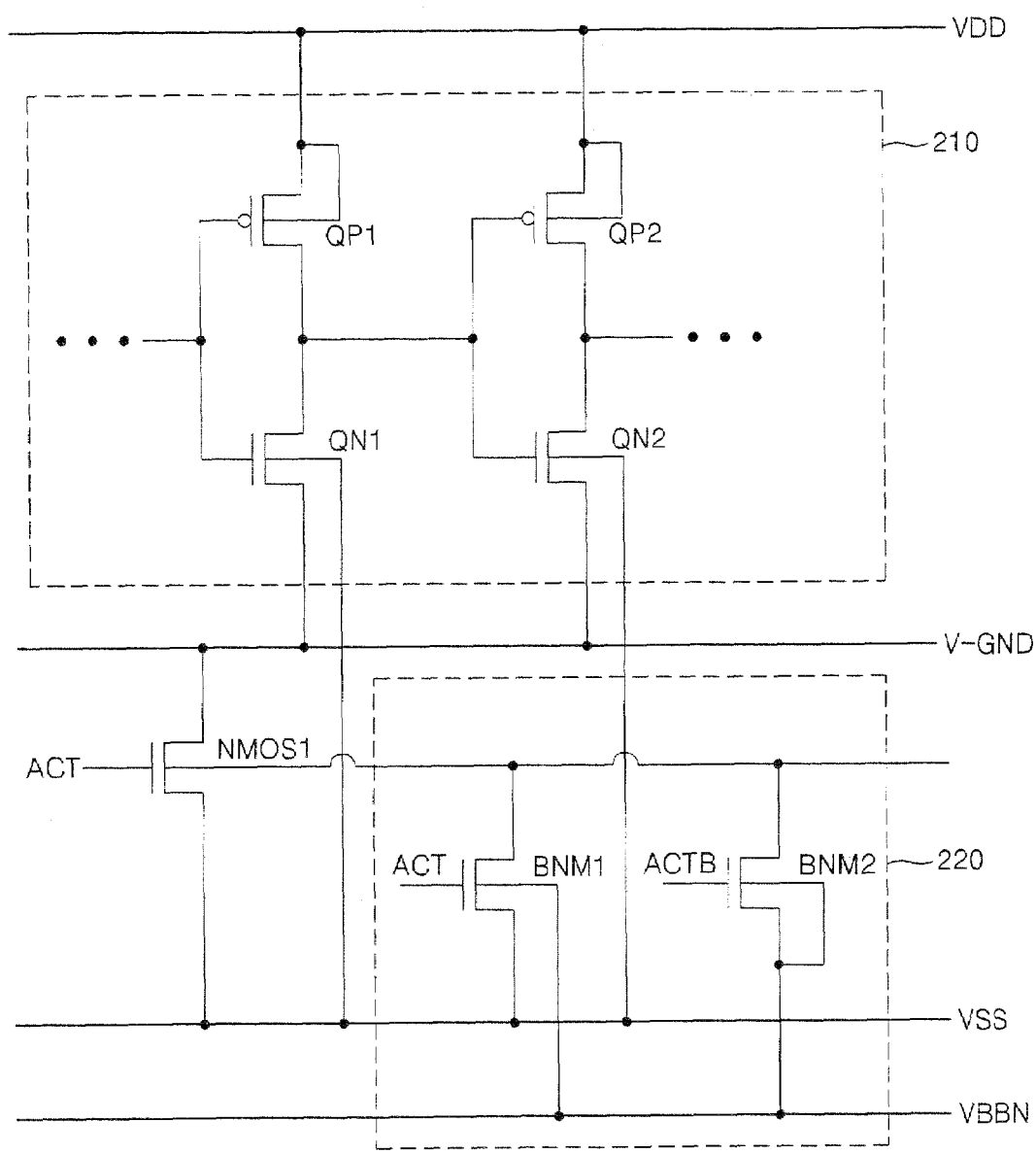
FIG. 2 is a circuit diagram illustrating a semiconductor integrated circuit according to a first embodiment of the present invention.

FIG. 2 is a circuit diagram illustrating a semiconductor integrated circuit according to a first embodiment of the present invention.

Referring to FIG. 2, a logic circuit portion 210 performs substantially the same function as the logic circuit portion 10 of FIG. 1 and includes MOS transistors QP1, QP2, QN1, and QN2, which have low threshold voltages. Here, the low threshold voltage is different in the PMOS transistors QP1 and QP2 and the NMOS transistors QN1 to QN2 and is an absolute value regardless of a polarity. Thus, the PMOS transistors QP1 and QP2 may have a first threshold voltage, while the NMOS transistors NP1 and NP2 may have a second threshold voltage.

The logic circuit portion 210 also includes a plurality of inverters. Each of the transistors of the logic circuit portion 210 receives the power voltage VDD or the ground voltage VSS through its body. That is, the PMOS transistors QP1 and QP2 receive the power voltage VDD through their bodies, and the NMOS transistors QN1 and QN2 receive the ground voltage VSS through their bodies. Herein, the power line that supplies the power voltage VDD and the ground voltage line that supplies the ground voltage VSS may be generically referred to as voltaic lines, where a voltaic line may supply either the power voltage VDD or the ground voltage VSS.

An NMOS transistor NMOS1 is a MOS transistor which has the second threshold voltage like the NMOS transistors QN1 and QN2 of the logic circuit portion 210. The NMOS transistor NMOS1 is designed to drive a large amount of electric current to supply the logic circuit portion 210 with a sufficient electric current.

In case where the number of MOS transistors of the logic circuit portion 210 to be driven is large, a plurality of NMOS transistors NMOS1 can be arranged.

The gate of the NMOS transistor NMOS1 receives the active signal ACT which determines the active state or the standby state of the logic circuit portion 210 from an external source.

A control portion 220 may apply a bias voltage to the body of the NMOS transistor NMOS1, and includes two NMOS transistors, first and second control transistors BNM1 and BNM2.

The first control transistor BNM1 is connected between the body of the NMOS transistor NMOS1 and the ground voltage VSS and receives a bulk power VBBN through its body to maintain a third threshold voltage which is higher than the NMOS transistors QN1 and QN2 of the logic circuit portion 210. The first control transistor BNM1 receives the active signal ACT through its gate to supply the ground voltage VSS to the body of the NMOS transistor NMOS1.

The second control transistor BNM2 is connected between the body of the NMOS transistor NMOS1 and the bulk power VBBN and receives the bulk power through the body to maintain the third threshold voltage which is higher than the NMOS transistors QN1 and QN2 of the logic circuit portion 210. The second control transistor BNM2 receives an inverted active signal ACTB through its gate to supply the bulk voltage VBBN to the body of the NMOS transistor NMOS1.

The bulk voltage VBBN supplies a lower voltage than the ground voltage VSS and is applied to the bodies of the NMOS transistor NMOS1 and the first and second control transistors BNM1 and BNM2 to raise the threshold voltage of the control transistors BNM1 and BNM2.

Operation of the semiconductor integrated circuit according to the first embodiment of the present invention will now be explained with reference to FIG. 2. When the logic circuit portion 210 is in the standby state, the active signal ACT having a low level and the inverted active signal ACTB having a high level are applied. The NMOS transistor NMOS1 and the first control transistor BNM1 to which the active signal ACT is applied are turned off, and the second control transistor BNM2 to which the inverted active signal ACTB is applied is turned on.

When the second control transistor BNM2 is turned on, the bulk power is applied to the body of the NMOS transistor NMOS1, so that the threshold voltage of the NMOS transistor NMOS1, which is turned off, is maintained high and the leakage current is blocked.

When the active signal ACT transitions to a high level, the NMOS transistor NMOS1 and the first control transistor BNM1 are turned on, and the inverted active signal ACTB transitions to a low level, so that the second control transistor BNM2 is turned off.

Since the first control transistor BNM1 has the high third threshold voltage, the ground voltage VSS is applied to the NMOS transistor NMOS1 when the active signal ACT is raised higher than the third threshold voltage, and thus the NMOS transistor NMOS1 maintains the high third threshold voltage.

When the active signal ACT is raised higher than the third threshold voltage, the first control transistor BNM1 applies the ground voltage VSS to the body of the NMOS transistor NMOS1, and the threshold voltage of the NMOS transistor NMOS1 is lowered to the second threshold voltage. The NMOS transistor NMOS1 whose threshold voltage is lowered applies the ground voltage VSS to the virtual ground V-GND.

When the ground voltage VSS is supplied to the virtual ground V-GND, the logic circuit portion 210 transitions to the active state in which an electric current path is formed and a predetermined operation is performed.

Unlike the semiconductor integrated circuit of FIG. 1, the ground voltage applied to the virtual ground V-GND does not suddenly vary, and the threshold voltage of the NMOS transistor NMOS1 is low, resulting in a smoothly supplied electric current.

When the operation of the logic circuit portion 210 is completed and goes to the standby state, the active signal ACT transitions to a low level, and the inverted active signal ACTB transitions to a high level.

The second control transistor BNM2 which receives the inverted active signal ACTB is turned on to apply the bulk power VBBN to the NMOS transistor NMOS1 when the inverted active signal ACTB is raised higher than the third threshold voltage due to the high third threshold voltage, and thus the NMOS transistor NMOS1 maintains the low second threshold voltage.

When the inverted active signal ACTB is raised higher than the third threshold voltage, the second control transistor BNM2 applies the bulk power VBBN to the body of the NMOS transistor NMOS1, and the threshold voltage of the NMOS transistor NMOS1 is raised to the third threshold voltage. The NMOS transistor NMOS1 whose threshold voltage is raised to the third threshold voltage blocks the ground voltage VSS applied to the virtual ground V-GND, thereby blocking the leakage current.

That is, when the logic circuit portion 210 is in the standby state, the high threshold voltage is maintained to block the leakage current at maximum, and when the logic circuit portion 210 transitions to the active state, it gradually transitions to the high threshold voltage, thereby preventing the noise from occurring and making the electric current smoothly flow.

Since the low threshold voltage gradually transitions to the high threshold voltage, the noise is reduced, and the leakage current is blocked.

Figure 3:
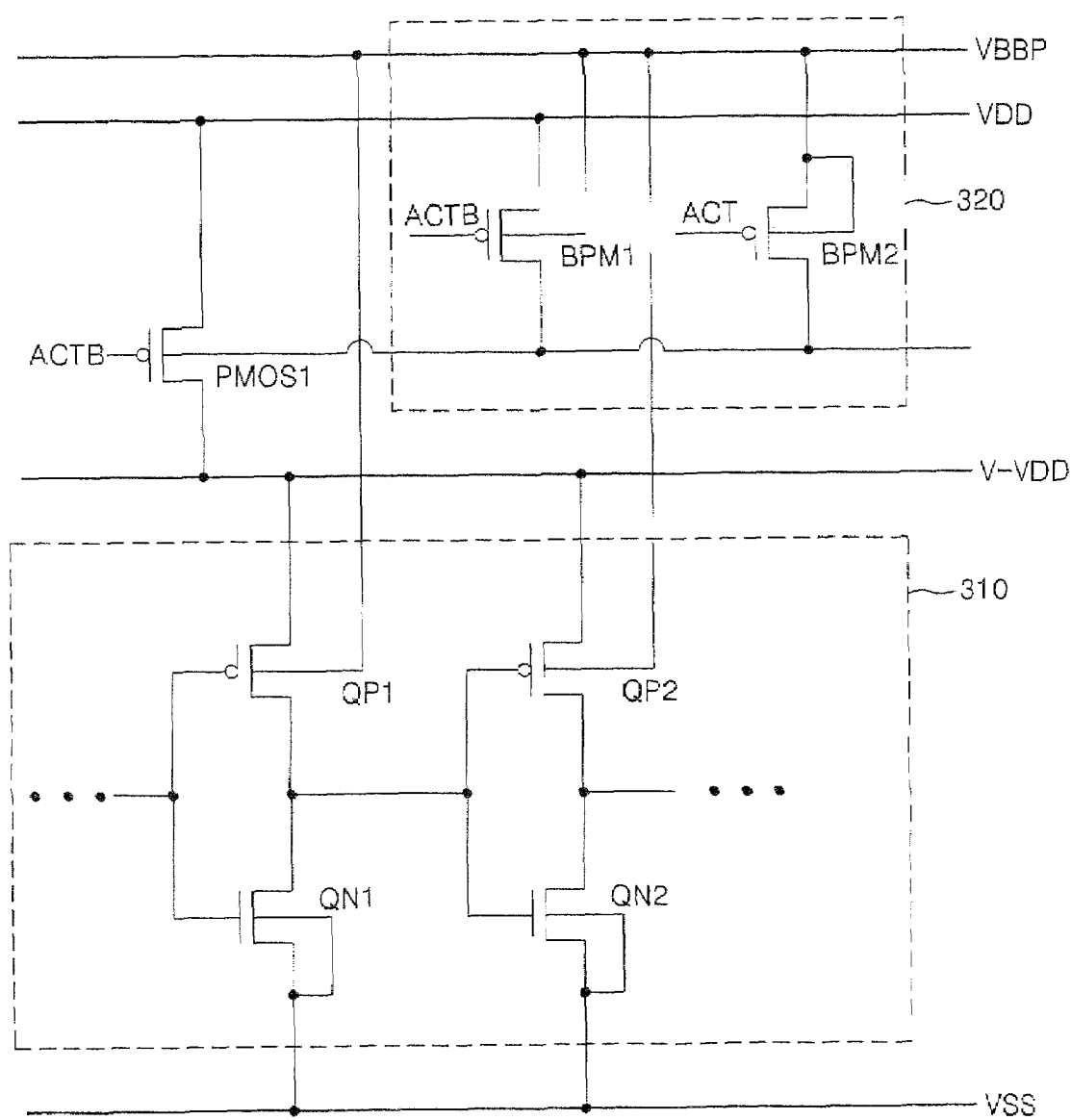
FIG. 3 is a circuit diagram illustrating a semiconductor integrated circuit according to a second embodiment of the present invention.

FIG. 3 is a circuit diagram illustrating a semiconductor integrated circuit with low power consumption according to a second embodiment of the present invention.

Referring to FIG. 3, a logic circuit portion 310 performs substantially the same function as the logic circuit portion 210 of FIG. 2 and includes transistors QP1, QP2, QN1, and QN2 which have a low threshold voltages. Here, the low threshold voltages are different in the PMOS transistors QP1 and QP2 than in the NMOS transistors QN1 to QN2, not taking polarity into account. Thus, the PMOS transistors QP1 and QP2 may have a first threshold voltage, and the NMOS transistors NP1 and NP2 may have a second threshold voltage, where the absolute value of the first threshold voltage is different from the absolute value of the second threshold voltage.

The logic circuit portion 310 may include a plurality of inverters (not shown). Each of the transistors of the logic circuit portion 310 receives the power voltage VDD or the ground voltage VSS through its body. That is, the PMOS transistors QP1 and QP2 may receive the power voltage VDD through their bodies, while the NMOS transistors QN1 and QN2 may receive the ground voltage VSS through their bodies.

A PMOS transistor PMOS1 is a MOS transistor that may be selected so as to have the first threshold voltage like the PMOS transistors QPN1 and QP2 of the logic circuit portion 310. The PMOS transistor PMOS1 is designed to drive large amounts of electric current to supply the logic circuit portion 310 with a sufficient electric current.

In an instance where there is a large number of MOS transistors of the logic circuit portion 310 to be driven, a plurality of PMOS transistors PMOS1 can be arranged.

The gate of the PMOS transistor PMOS1 receives the inverted active signal ACTB, which determines the active state or the standby state of the logic circuit portion 310 from an external source.

A control circuit portion 320 may be arranged to apply a bias voltage to the body of the PMOS transistor PMOS1, and may include two PMOS transistors, first and second control transistors BPM1 and BPM2.

The first control transistor BPM1 may be connected between the body of the PMOS transistor PMOS1 and the power voltage VDD and may receive a bulk power VBBP through its body to maintain a third threshold voltage that has a higher absolute value than the first threshold voltage of PMOS transistors QP1 and QP2 of the logic circuit portion 310. In operation, the first control transistor BPM1 receives the inverted active signal ACTB through its gate to supply the power voltage VDD to the body of the PMOS transistor PMOS1.

The second control transistor BPM2 is connected between the body of the PMOS transistor PMOS1 and the bulk power VBBP and receives the bulk power through its body to maintain the third threshold voltage which has a higher absolute value than the first threshold voltage of the PMOS transistors QP1 and QP2 of the logic circuit portion 310. In operation, the second control transistor BPM2 receives the active signal ACT through its gate to supply the bulk voltage VBBP to the body of the PMOS transistor PMOS1.

The bulk voltage VBBP supplies a higher voltage than the power voltage VDD and may be applied to the bodies of the the first and second control transistors BPM1 and BPM2 to raise the threshold voltages of the control transistors BPM1 and BPM2. In addition, the buck voltage VBBP may be applied to the body of the PMOS transistor PMOS1 in particular operational modes as described below.

The operation of the semiconductor integrated circuit according to the second embodiment of the present invention will now be explained with reference to FIG. 3. When the logic circuit portion 310 is in a standby state, the active signal ACT has a low level and the inverted active signal ACTB has a high level. In this standby state, the PMOS transistor PMOS1 and the first control transistor BPM1, to which the inverted active signal ACTB is applied, are turned off, and the second control transistor BPM2, to which the active signal ACT is applied, is turned on.

When the second control transistor BPM2 is turned on, the bulk power is applied to the body of the PMOS transistor PMOS1, so that the threshold voltage of the PMOS transistor PMOS1 which is turned off is maintained in a high state and the leakage current is blocked.

When the logic circuit portion is prompted to return to an active state, the inverted active signal ACTB transitions to a low level and the active signal ACT transitions to a high level. As a result, the PMOS transistor PMOS1 and the first control transistor BPM1 are turned on, and the second control transistor BPM2 is turned off.

Since the first control transistor BPM1 has the high third threshold voltage, the power voltage VDD is applied to the PMOS transistor PMOS1 when the inverted active signal ACTB drops lower than the third threshold voltage, and thus the PMOS transistor PMOS1 maintains the high third threshold voltage.

When the inverted active signal ACTB drops lower than the third threshold voltage, the first control transistor BPM1 applies the power voltage VDD to the body of the PMOS transistor PMOS1, and the threshold voltage of the PMOS transistor PMOS1 is lowered to the first threshold voltage. In this instance, the PMOS transistor PMOS1, whose threshold voltage is lowered, applies the power voltage VDD to the virtual power V-VDD.

When the power voltage VDD is supplied to the virtual power V-VDD, the logic circuit portion 310 goes to the active state and an electric current path is formed to perform a predetermined operation.

Like the semiconductor integrated circuit of FIG. 2, the power voltage applied to the virtual power V-VDD does not suddenly vary and the threshold voltage of the PMOS transistor PMOS1 is relatively low, resulting in a smoothly supplied electric current.

When the operation of the logic circuit portion 310 is completed and the semiconductor integrated circuit transitions from an active state to a standby state the active signal ACT transitions to a low level, and the inverted active signal ACTB transitions to a high level.

Here, the second control transistor BPM2, which receives the active signal ACT, is turned on and applies the bulk power VBBP to the PMOS transistor PMOS1 when the active signal ACT drops lower than the third threshold voltage thus allowing the PMOS transistor PMOS1 to maintain the low second threshold voltage.

In addition, when the active signal ACT drops lower than the third threshold voltage, the second control transistor BPM2 applies the bulk power VBBP to the body of the PMOS transistor PMOS1, and the threshold voltage of the PMOS transistor PMOS1 is raised to the third threshold voltage. The PMOS transistor PMOS1, whose threshold voltage is raised to the third threshold voltage, blocks the power voltage VDD from being applied to the virtual power V-VDD, which in turn blocks leakage current.

Since the threshold voltage of the PMOS transistor PMOS1 is gradually transitioned from a low threshold voltage to the high threshold voltage noise may also be reduced.

That is, when the logic circuit portion 310 is in a standby state, the high threshold voltage is maintained to block the leakage current, and when the logic circuit portion 310 transitions to an active state, it gradually transitions to the low threshold voltage, thereby preventing noise from occurring and allowing the electric current to flow smoothly.

Figure 4:
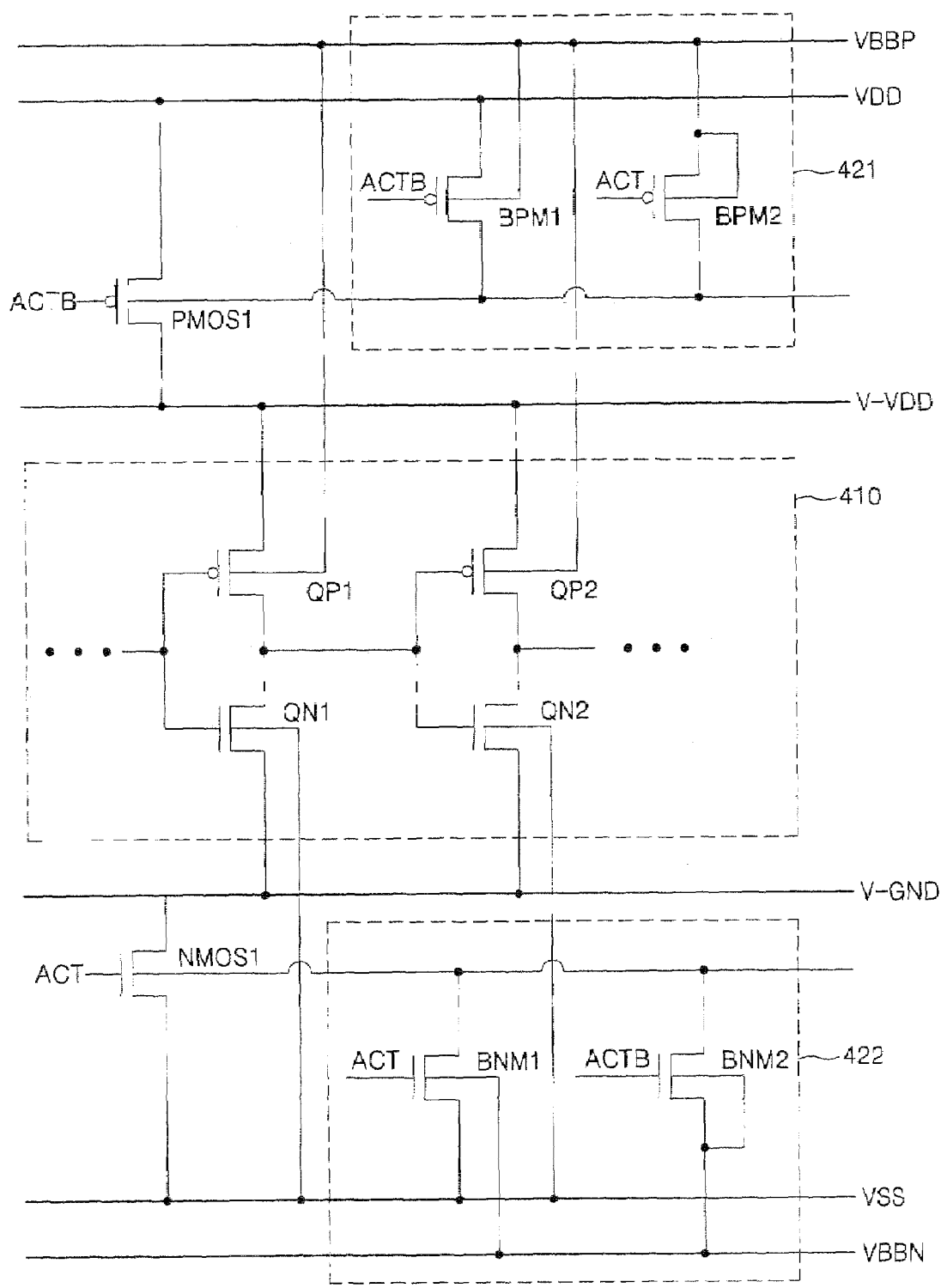
FIG. 4 is a circuit diagram illustrating a semiconductor integrated circuit according to a third embodiment of the present invention.

FIG. 4 is a circuit diagram illustrating a semiconductor integrated circuit with lower power consumption according to a third embodiment of the present invention.

Referring to FIG. 4, a logic circuit portion 410 performs substantially the same function as the logic circuit portions 210 and 310 of FIGS. 2 and 3 and includes transistors QP1, QP2, QN1, and QN2, which have low threshold voltages. Here, the PMOS transistors QP1 and QP2 may have a different low threshold voltages than the NMOS transistors QN1 to QN2 not taking polarity into account. That is, the PMOS transistors QP1 and QP2 may have a first threshold voltage, and the NMOS transistors NP1 and NP2 may have a second threshold voltage, where the absolute value of the first threshold voltage is different from the absolute value of the second threshold voltage.

Each of the transistors of the logic circuit portion 410 receives the power voltage VDD or the ground voltage VSS through its body. That is, the PMOS transistors QP1 and QP2 receive the power voltage VDD through their bodies, and the NMOS transistors QN1 and QN2 receive the ground voltage VSS through their bodies.

A PMOS transistor PMOS1 and an NMOS transistor NMOS1 are MOS transistors which have low threshold voltages. In particular, the PMOS transistor PMOS1 may be selected to have the first threshold voltage like the PMOS transistors QP1 and QP2 of the logic circuit portion 410, and the NMOS transistor NMOS1 may be selected to have the second threshold voltage like the NMOS transistors QN1 and QN2 of the logic circuit portion 410.

The PMOS transistor PMOS1 and the NMOS transistor NMOS1 are designed to drive large amounts of electric current to supply the logic circuit portion 410 with a sufficient electric current.

In instances where the there is a large number of MOS transistors of the logic circuit portion 410 to be driven, a plurality of PMOS transistors PMOS1 and/or a plurality of NMOS transistors NMOS1 can be arranged.

The gate of the NMOS transistor NMOS1 receives the active signal ACT, which determines whether the logic circuit portion is in an active state or standby state, and the gate of the PMOS transistor PMOS1 receives the inverted active signal ACTB.

A first control portion 421 is arranged to apply a bias voltage to the body of the PMOS transistor PMOS1, and includes two PMOS transistors, first and second PMOS control transistors BPM1 and BPM2.

The first PMOS control transistor BPM1 is connected between the body of the PMOS transistor PMOS1 and the power voltage VDD and receives a first bulk power VBBP through its body to maintain a third threshold voltage, which is higher than the first threshold voltage of the PMOS transistors QP1 and QP2 of the logic circuit portion 410. When the first PMOS control transistor BPM1 receives the inverted active signal ACTB through its gate, it supplies the power voltage VDD to the body of the PMOS transistor PMOS1.

The second PMOS control transistor BPM2 is connected between the body of the PMOS transistor PMOS1 and the first bulk power VBBP and receives the first bulk power through its body to maintain the third threshold voltage, which is higher than the first threshold voltage of the PMOS transistors QP1 and QP2 of the logic circuit portion 410. When the second PMOS control transistor BPM2 receives the active signal ACT through its gate it supplies the first bulk voltage VBBP to the body of the PMOS transistor PMOS1.

A second control portion 422 is arranged to apply a bias voltage to the body of the NMOS transistor NMOS1, and includes two NMOS transistors, first and second NMOS control transistors BNM1 and BNM2.

The first NMOS control transistor BNM1 is connected between the body of the NMOS transistor NMOS1 and the ground voltage VSS and receives a second bulk power VBBN through its body to maintain a fourth threshold voltage, which is higher than the second threshold voltage of the NMOS transistors QN1 and QN2 of the logic circuit portion 410. When the first NMOS control transistor BNM1 receives the active signal ACT through its gate, it supplies the ground voltage VSS to the body of the NMOS transistor NMOS1.

The second NMOS control transistor BNM2 is connected between the body of the NMOS transistor NMOS1 and the second bulk power VBBN and receives the second bulk power through its body to maintain the fourth threshold voltage, which is higher than the second threshold voltage of the NMOS transistors QN1 and QN2 of the logic circuit portion 410. When the second NMOS control transistor BNM2 receives the inverted active signal ACTB through its gate, it supplies the second bulk voltage VBBN to the body of the NMOS transistor NMOS1.

The first bulk voltage VBBP supplies a higher voltage than the power voltage VDD and is applied to the bodies of the PMOS transistor PMOS1 and the first and second PMOS control transistors BPM1 and BPM2 to raise the threshold voltage of the PMOS control transistors BPM1 and BPM2.

The second bulk voltage VBBN supplies a lower voltage than the ground voltage VSS and is applied to the bodies of the NMOS transistor NMOS1 and the first and second NMOS control transistors BNM1 and BNM2 to raise the threshold voltage of the NMOS control transistors BNM1 and BNM2.

An operation of the semiconductor integrated circuit according to the third embodiment of the present invention will now be explained with reference to FIG. 4. When the logic circuit portion 410 is in a standby state, the active signal ACT having a low level and the inverted active signal ACTB having a high level are applied. The NMOS transistor NMOS1 and the first NMOS control transistor BNM1 to which the active signal ACT is applied are turned off, and the second NMOS control transistor BNM2 to which the inverted active signal ACTB is applied is turned on.

Also, the PMOS transistor PMOS1 and the first PMOS control transistor BPMI to which the inverted active signal ACTB is applied are turned off, and the second PMOS control transistor BPM2 to which the active signal ACT is applied is turned on.

When the second NMOS control transistor BNM2 and the second PMOS control transistor BPM2 are turned on, the first and second bulk powers are respectively applied to the body of the NMOS transistor NMOS1 and the body of the PMOS transistor PMOS1. This arrangement results in maintaining the threshold voltages of the NMOS transistor NMOS1 and the PMOS transistor PMOS1, which are turned off, at a high level to block leakage currents.

When the active signal ACT transitions to a high level, the NMOS transistor NMOS1 and the first NMOS control transistor BNM1 are turned on, and the inverted active signal ACTB transitions to a low level, so that the second NMOS control transistor BNM2 is turned off. Also, when the inverted active signal ACTB transitions to a low level, the PMOS transistor PMOS1 and the first PMOS control transistor BPM1 are turned on, and the active signal ACT transitions to a high level, so that the second PMOS control transistor BPM2 is turned off.

Since the first NMOS control transistor BNM1 has the high fourth threshold voltage, the ground voltage VSS is applied to the NMOS transistor NMOS1 when the active signal ACT is raised higher than the fourth threshold voltage, which results in the NMOS transistor NMOS1 maintaining the high fourth threshold voltage. Also, since the first PMOS control transistor BPM1 has the high third threshold voltage, the power voltage VDD is applied to the PMOS transistor PMOS1 when the inverted active signal ACTB drops lower than the third threshold voltage, which results in the PMOS transistor PMOS1 maintaining the high third threshold voltage.

When the active signal ACT is raised higher than the fourth threshold voltage and the inverted active signal ACTB drops lower than the third threshold voltage, the first NMOS control transistor BNM1 applies the ground voltage VSS to the body of the NMOS transistor NMOS1, and the first PMOS control transistor BPM1 applies the power voltage VDD to the body of the PMOS transistor PMOS1. This transition results in the threshold voltages of the NMOS transistor NMOS1 and the PMOS transistor PMOS1 being lowered to the second threshold voltage and the first threshold voltage, respectively. As a consequence, the NMOS transistor NMOS1, whose threshold voltage is lowered to the second threshold voltage, applies the ground voltage VSS to the virtual ground V-GND, and the PMOS transistor PMOS1, whose threshold voltage is lowered to the first threshold voltage, applies the power voltage VDD to the virtual power V-VDD.

When the ground voltage VSS is supplied to the virtual ground V-GND and the power voltage VDD is supplied to the virtual power V-VDD, the logic circuit portion 410 transitions to an active state in which an electric current path is formed and a predetermined operation is performed.

Thus, the ground voltage applied to the virtual ground V-GND and the power voltage applied to the virtual power V-VDD do not suddenly vary; rather because the threshold voltages of the NMOS transistor NMOS1 and the PMOS transistor PMOS1 are low, the electric current may be supplied smoothly.

When the operation of the logic circuit portion 410 is completed, the logic circuit portion may preferably transition back to a standby state. To initiate this transition, the active signal ACT transitions to a low level, and the inverted active signal ACTB transitions to a high level.

When the inverted active signal ACTB is raised higher than the fourth threshold voltage, the second NMOS control transistor BNM2 applies the second bulk power VBBN to the body of the NMOS transistor NMOS1, and the threshold voltage of the NMOS transistor NMOS1 is raised to the fourth threshold voltage. The NMOS transistor NMOS1 whose threshold voltage is raised to the fourth threshold voltage blocks the ground voltage VSS applied to the virtual ground V-GND, thereby blocking the leakage current.

When the active signal ACT drops lower than the third threshold voltage, the second PMOS control transistor BPM2 applies the first bulk power VBBP to the body of the PMOS transistor PMOS1, and the threshold voltage of the PMOS transistor PMOS1 is raised to the third threshold voltage. The PMOS transistor PMOS1 whose threshold voltage is raised to the third threshold voltage blocks the power voltage VDD applied to the virtual power V-VDD, thereby blocking the leakage current.

That is, when the logic circuit portion 410 is in the standby state, a high threshold voltage is maintained to block leakage currents, and when the logic circuit portion 410 transitions to the active state, it gradually transitions to the low threshold voltage, thereby preventing noise from occurring and making the electric current flow smoothly.

Since the high threshold voltage also gradually transitions to the low threshold voltage when the logic circuit portion 410 returns to a standby state, noise can be reduced, and leakage current can be blocked.

As described above, the semiconductor integrated circuit of the present invention includes a MOS transistor having a low threshold voltage instead of the MOS transistor having a high threshold voltage in the MTCMOS circuit. The circuit further includes a control portion to apply a bulk voltage to the body of the MOS transistor in a standby state to raise the threshold voltage of the MOS transistor and thereby block leakage current. Further, during transitions between a standby state and an active state an electric current by continue to be supplied in a smooth manner so prevent noise in the circuit. In addition, the MOS transistor is turned on or off by the control portion for adjusting the threshold voltage of the MOS transistor, and thus noise induced from the power voltage and the ground voltage can be reduced.

What is claimed is:

1. A semiconductor integrated circuit, comprising:
   a logic circuit connected between a first power line and a virtual ground line, the logic circuit including at least one NMOS transistor having a first threshold voltage and at least one PMOS transistor having a second threshold voltage;
   a first MOS transistor connected between the virtual ground line and a ground voltage line and having the first threshold voltage, the first MOS transistor applying a ground voltage to the virtual ground line in an active state; and a controller connected to the first MOS transistor to control a threshold voltage of the first MOS transistor, the controller applying the ground voltage to the first MOS transistor in the active state and applying a bulk voltage supplied from a bulk power line in a standby state, wherein the bulk voltage is different in power than the first power line.

2. The circuit of claim 1, wherein the first MOS transistor receives the ground voltage through its body to maintain the first threshold voltage in the active state and receives the bulk voltage through its body to transition to a third threshold voltage which is higher than the first threshold voltage in the standby state, the first MOS transistor applying the ground voltage to the virtual ground line in response to an active signal applied to a gate of the first MOS transistor during the active state.

3. The circuit of claim 2, wherein the controller includes
a second MOS transistor connected between the body of the first MOS transistor and the ground voltage line, the second MOS transistor having a body connected to the bulk power line and having the third threshold voltage, where the second MOS transistor applies the ground voltage to the body of the first MOS transistor in response to the active signal being applied to a gate of the second MOS transistor during the active state; and
a third MOS transistor connected between the body of the first MOS transistor and the bulk power line, the third MOS transistor having a body connected to the bulk power line and having a third threshold voltage, where the third MOS transistor applies the bulk voltage to the body of the first MOS transistor in response to an inverted active signal being applied to a gate of the third MOS transistor during the standby state.

4. The circuit of claim 3, wherein the first to third MOS transistors are NMOS transistors.

5. The circuit of claim 1, wherein the bulk power line is lower in power than the ground voltage line.

6. A semiconductor integrated circuit, comprising:
a logic circuit connected between a ground voltage line and a virtual power line, the logic circuit including at least one NMOS transistor having a first threshold voltage and at least one PMOS transistor having a second threshold voltage;
a first MOS transistor connected between the virtual power line and a first power line and having the second threshold voltage, the first MOS transistor applying a power voltage to the virtual power line in an active state; and
a controller connected to the first MOS transistor to control a threshold voltage of the first MOS transistor, the controller applying the power voltage to the first MOS transistor in the active state and applying a bulk voltage supplied from a bulk power line in a standby state, wherein the bulk power line is higher in power than the first power line.

7. The circuit of claim 6, wherein the first MOS transistor receives the power voltage through its body to maintain the second threshold voltage in the active state and receives the bulk voltage through its body to transition to a third threshold voltage which is higher than the second threshold voltage in the standby state, the first MOS transistor applying the power voltage to the virtual power line in response to an inverted active signal applied to a gate of the first MOS transistor during the active state.

8. The circuit of claim 7, wherein the controller includes
a second MOS transistor connected between the body of the first MOS transistor and the first power line, the second MOS transistor having a body connected to the bulk power line and having a third threshold voltage, where the second MOS transistor applies the power voltage to the body of the first MOS transistor in response to the inverted active signal being applied to a gate of the second MOS transistor during the active state; and
a third MOS transistor connected between the body of the first MOS transistor and the bulk power line, the third MOS transistor having a body connected to the bulk power line and having a third threshold voltage, where the third MOS transistor applies the bulk voltage to the body of the first MOS transistor in response to an active signal being applied to a gate of the third MOS transistor during the standby state.

9. The circuit of claim 8, wherein the first to third MOS transistors are PMOS transistors.

10. A semiconductor integrated circuit, comprising:
a logic circuit connected between a virtual power line and a virtual ground line, the logic circuit including at least one PMOS transistor having a first threshold voltage and at least one NMOS transistor having a second threshold voltage;
a first MOS transistor connected between the virtual power line and a first power line and having the first threshold voltage, the first MOS transistor applying a power voltage to the virtual power line in an active state;
a second MOS transistor connected between the virtual ground line and a ground voltage line and having the second threshold voltage, the second MOS transistor applying the ground voltage to the virtual ground line in an active state;
a first controller connected to the first MOS transistor to control a threshold voltage of the first MOS transistor, the first controller applying the power voltage to the first MOS transistor in the active state and applying a first bulk voltage supplied from a first bulk power line in a standby state; and
a second controller connected to the second MOS transistor to control a threshold voltage of the second MOS transistor, the second controller applying the ground voltage to the second MOS transistor in the active state and applying a second bulk voltage supplied from a second bulk power line in a standby state, wherein the bulk power line is different in power from at least one of the first or second power lines.

11. The circuit of claim 10, wherein the first MOS transistor receives the power voltage through its body to maintain the first threshold voltage in the active state and receives the first bulk voltage through its body to transition to a third threshold voltage which is higher than the first threshold voltage in the standby state, the first MOS transistor applying the power voltage to the virtual power line in response to an inverted active signal applied to a gate of the first MOS transistor during the active state.

12. The circuit of claim 11, wherein the first controller includes
a third MOS transistor connected between the body of the first MOS transistor and the first power line, the third MOS transistor having a body connected to the first bulk power line and having the third threshold voltage, where the third MOS transistor applies the power voltage to the body of the first MOS transistor in response to the inverted active signal being applied to a gate of the third MOS transistor during the active state; and a fourth MOS transistor connected between the body of the first MOS transistor and the first bulk power line, the fourth MOS transistor having a body connected to the first bulk power line and having a third threshold voltage, where the fourth MOS transistor applies the first bulk voltage to the body of the first MOS transistor in response to an active signal being applied to the gate of the fourth MOS transistor during the standby state.

13. The circuit of claim 1, wherein the first, the third, and the fourth MOS transistors are PMOS transistors.

14. The circuit of claim 1, wherein the second MOS transistor receives the ground voltage through its body to maintain the second threshold voltage in an active state and receives the second bulk voltage through its body to transition to a fourth threshold voltage which is higher than the second threshold voltage in the standby state, the second MOS transistor applying the ground voltage to the virtual ground line in response to an active signal applied to a gate of the second MOS transistor during the active state.

15. The circuit of claim 14, wherein the second controller includes a fifth MOS transistor connected between the body of the second MOS transistor and the ground voltage line, the fifth MOS transistor having a body connected to the second bulk power line and having the fourth threshold voltage, where the fifth MOS transistor applies the ground voltage to the body of the second MOS transistor in response to the active signal being applied to agate of the fifth MOS transistor during the active state; and a sixth MOS transistor connected between the body of the second MOS transistor and the second bulk power line, the sixth MOS transistor having a body connected to the second bulk power line and having the fourth threshold voltage, where the sixth MOS transistor applies the second bulk voltage to the body of the second MOS transistor in response to an inverted active signal applied to a gate of the sixth MOS transistor during the standby state.

16. The circuit of claim 15, wherein the second, the fifth, and the sixth MOS transistors are NMOS transistors.

17. The circuit of claim 10, wherein the first bulk power line is higher in power than the first power line.

18. The circuit of claim 10, wherein the second bulk power line is lower in power than the second power line.

19. A semiconductor integrated circuit, comprising:

a logic circuit connected between a first power line and a virtual ground line, the logic circuit including at least one NMOS transistor having a first threshold voltage and at least one PMOS transistor having a second threshold voltage;

a first MOS transistor connected between the virtual ground line and a ground voltage line and having the first threshold voltage, the first MOS transistor applying a ground voltage to the virtual ground line in an active state, wherein the first MOS transistor receives the ground voltage through its body to maintain the first threshold voltage in the active state and receives the bulk voltage through its body to transition to a third threshold voltage which is higher than the first threshold voltage in the standby state, the first MOS transistor applying the ground voltage to the virtual ground line in response to an active signal applied to a gate of the first MOS transistor during the active state; and a controller connected to the first MOS transistor to control a threshold voltage of the first MOS transistor, the controller applying the ground voltage to the first MOS transistor in the active state and applying a bulk voltage supplied from a bulk power line in a standby state, wherein the controller includes:

a second MOS transistor connected between a body of the first MOS transistor and the ground voltage line, the second MOS transistor having a body connected to the bulk power line and having the third threshold voltage, where the second MOS transistor applies the ground voltage to the body of the first MOS transistor in response to the active signal being applied to a gate of the second MOS transistor during the active state, and a third MOS transistor connected between the body of the first MOS transistor and the bulk power line, the third MOS transistor having a body connected to the bulk power line and having a third threshold voltage, where the third MOS transistor applies the bulk voltage to the body of the first MOS transistor in response to an inverted active signal being applied to a gate of the third MOS transistor during the standby state.

20. The circuit of claim 19, wherein the first to third MOS transistors are NMOS transistors.

21. The circuit of claim 19, wherein the bulk power line is lower in power than the ground voltage line.

22. The circuit of claim 19, wherein the bulk power line is higher in power than the first power line.

* * * * *

UNITED STATES PATENT AND TRADEMARK OFFICE
CERTIFICATE OF CORRECTION

PATENT NO.         : 7,394,290 B2                                                                Page 1 of 1
APPLICATION NO.    : 11/422856
DATED              : July 1, 2008
INVENTOR(S)        : Young-Hun Seo et al.

It is certified that error appears in the above-identified patent and that said Letters Patent is hereby corrected as shown below:

Column 9, line 17, the word "BPMI" should read -- BPM1 --;
   Column 13, line 13 claim 13, the words "claim 1" should read -- claim 12 --;
   Column 13, line 15 claim 14, the words "claim 1" should read -- claim 10 --;
   Column 13, line 32 claim 15, the word "agate" should read -- a gate --.

Signed and Sealed this

Twenty-fifth Day of May, 2010

David J. Kappos
*Director of the United States Patent and Trademark Office*